United States Patent [19]

Kalejs

[11] 4,443,411

[45] Apr. 17, 1984

[54] APPARATUS FOR CONTROLLING THE ATMOSPHERE SURROUNDING A CRYSTAL GROWTH ZONE

[75] Inventor: Juris P. Kalejs, Wellesley, Mass.

[73] Assignee: Mobil Solar Energy Corporation, Waltham, Mass.

[21] Appl. No.: 294,737

[22] Filed: Aug. 20, 1981

Related U.S. Application Data

[63] Continuation-in-part of Ser. No. 216,370, Dec. 15, 1980.

[51] Int. Cl.³ .............................................. C30B 15/34
[52] U.S. Cl. ............................ 422/246; 156/DIG. 89
[58] Field of Search .............. 422/246; 156/608, 619, 156/DIG. 89, DIG. 73

[56] References Cited

U.S. PATENT DOCUMENTS

| | | | |
|---|---|---|---|
| 2,889,240 | 6/1959 | Rosi | 156/619 |
| 3,124,489 | 3/1964 | Vogel et al. | 156/608 |
| 3,265,469 | 8/1966 | Hall | 156/608 |
| 4,221,754 | 9/1980 | Nowak | 156/619 |
| 4,239,734 | 12/1980 | Ciszek | 422/246 |

FOREIGN PATENT DOCUMENTS 54-134082 10/1979 Japan ..................... 156/DIG. 89

Primary Examiner—Hiram H. Bernstein
Attorney, Agent, or Firm—Schiller & Pandiscio

[57] ABSTRACT

Method and apparatus for using a gas mixture containing an additive gas capable of beneficially altering the physical or chemical properties of a crystallized body grown from a melt by means of a shaping member. A suitable mixture of an inert gas and the additive gas is directed substantially uniformly over the entire melt surface of the meniscus existing between the top of the shaping member and the liquid/solid growth interface at which the crystallized body is formed. The method and apparatus are particularly suited to the growing of silicon ribbons from graphite crucibles for use in the production of photovoltaic solar cells, as evidenced by a substantial increase in the average minority carrier diffusion length in the silicon ribbon grown when the gas additive is a source of oxygen.

10 Claims, 10 Drawing Figures

APPARATUS FOR CONTROLLING THE ATMOSPHERE SURROUNDING A CRYSTAL GROWTH ZONE

The Government has rights on this invention under Contract No. NAS7-100, JPL Subcontract 954355.

This application is a continuation-in-part of my copending U.S. application Ser. No. 216,300, filed Dec. 15, 1980.

This invention relates to improvements in method and apparatus for growing elongated crystalline bodies from a melt of such materials as silicon, germanium, garnet, sapphire and the like, and more particularly to the growth of silicon ribbons for making photovoltaic solar cells.

Various methods are now known for growing crystalline bodies. One method which has been devised for growing crystalline bodies with diverse cross-sectional shapes with excellent dimensional control over long lengths is the so-called EFG technique which is exemplified and described in varying detail in U.S. Pat. Nos. 3,591,348, 3,687,633, 3,953,174 and 4,118,197. In the EFG method, a wettable capillary die conducts the melt from a reservoir supply (usually contained in a crucible) to the growing crystal interface just above the top of the die, with the shape of the resulting crystalline body being determined by the shape of the growth meniscus which in turn is controlled by the perimeter of the die top. Essentially the EFG method is concerned with growing a crystallized body from a melt using a shaping member, i.e., a die, in the growth zone.

The EFG method has been applied to or considered for growing crystals of such materials as silicon, germanium, garnet, sapphire and the like. Since, however, the growing of silicon for the fabrication of photovoltaic solar cells has assumed a high degree of importance and at the same time presents most of the more serious problems associated with crystal growth, it will be convenient to describe the method and apparatus of this invention in terms of growing silicon crystals.

The growth of silicon for use in making solar cells is complicated by the fact that the presence of crystallographic defects and certain impurities in the silicon have an adverse effect on solar cell efficiency. The presence of carbon and oxygen impurities in silicon crystals grown through the use of a shaping member has been noted.

As in the Czochralski or dendritic web melt-growth systems for silicon, carbon and oxygen levels in EFG grown silicon ribbon, can be expected to be influenced both by the type of crucible used and the composition of the ambient gases in contact with the melt. However, important distinctions must be made for the EFG process which limit the parallel that may be drawn in comparing the processes by which carbon and oxygen reach steady-state concentrations in the crystalline product. This situation arises in part from the isolation of the crucible (bulk) melt from the melt ahead of the growth interface (bounded by the meniscus at the EFG die top) dictated by the geometric configuration of the die, and in part because of the relatively high EFG growth speeds. The separation of the bulk and the meniscus allows temperature differences as large as 50 degrees C. to 100 degrees C. to be maintained between them under typical growth conditions, with the result that the mechanism controlling the occurrence of oxygen and silicon in EFG-grown crystals is not exactly the same as in the Czochralski process. The effect of carbon and oxygen impurities has not been known with certainty but both negative and positive influences of these on semiconductor silicon ribbon quality have been suggested.

It has been recognized that the presence of precipitated carbon in silicon causes the leakage current to be higher without any notable change in forward characteristics (see N. Akiyama et al, "Lowering of Breakdown Voltage of Semiconductor Silicon Due to the Precipitation of Impurity Carbon", *Appl. Physics Lett.*, Vol. 22, No. 12, pp. 630-631, 15 June 1973).

Other impurities which tend to occur as solutes in silicon bodies produced by the EFG method, and which have been found to have an adverse effect on the electronic properties of silicon, are: iron, titanium, copper, zirconium, molybdenum, aluminium, manganese and copper. Silicon carbide also occurs as an inclusion in the product. These additional impurities, like carbon and oxygen, may be derived from the dies, crucibles, associated heat control members such as heaters, heat shields, and insulators, and other furnace components and the ambient environment in the furnace. These additional impurities tend to be distributed throughout a silicon ribbon so as to reduce carrier lifetime generally through the ribbon and thus limit the conversion efficiency of solar cells made therefrom and also the total yield of high efficiency solar cells. As a consequence, the preferred practice in growing silicon ribbon by the EFG method has been to (a) make the dies, crucibles and furnace components out of materials with as high a purity as possible and (b) carry out the growth process in an inert gaseous environment using a gas of as high purity as possible.

The choice of die and crucible materials is complicated by the fact that molten silicon reacts with and/or dissolves most substances that may be likely candidates as die or crucible materials. Since a degree of reactivity between molten silicon and the die is unavoidable, it is desirable that the reaction product be electrically neutral in the silicon crystal or, if insoluble in silicon, be structurally compatible in order not to generate an excessive density of crystallographic defects which would lead to excessive polycrystallinity. Additionally, the die must be arranged and made of a material such that a crystallization front of suitable configuration may be maintained at all times, thereby to reduce the occurrence of dislocation defects in the crystals (in this connection it is to be noted that in the usual case a silicon ribbon grown by EFG is not an ideal single crystal but instead is generally rather imperfect in nature). In the growth of silicon, fused quartz, silicon nitride, silicon carbide and graphite have been considered most seriously as possible die materials. Fused quartz has been rejected since it is barely wetted by liquid silicon; silicon nitride is unacceptable since it tends to react too rapidly with molten silicon; silicon carbide is wetted by silicon and has adequate strength at the melting point of silicon, but the difficulty of machining silicon carbide per se makes it unacceptable in the case of capillary dies for growing relatively thin ribbons, such as ribbon with a thickness of 0.006 to 0.0020 inch. Also silicon carbide in forms suitable for making capillary dies is not available in adequate purity.

Because of the limitations of the foregoing die materials, current EFG silicon ribbon technology is based upon graphite dies since graphite has adequate strength at the melting point of silicon, is easily machinable, is available commercially in forms suitable for making capillary dies in greater purity than silicon carbide, and is wetted adequately and in a stable manner by silicon. In current EFG technology, it is preferred that the crucibles also be made of graphite, although quartz crucibles also have been used. However, the use of graphite dies is limited by the tendency for silicon carbide crystals to form at the die top as a consequence of the reaction of graphite and silicon (frequently to the point of stopping ribbon growth or providing variations in the shape of the ribbon or causing crystallization defects in the form of grain boundaries, voids or dislocations). These particles disturb the crystallization front and also tend to be picked up as occlusions by the growing crystal. With regard to silicon carbide occlusions, it is well established that silicon ribbons grown by EFG using graphite dies can have silicon carbide particles at levels which are harmful to solar cell performance and that a reduction in the occurrence of silicon carbide particles in the ribbon tends to result in an improvement in the yield of 10-12% efficiency solar cells obtainable from such ribbons.

The typical inert gas used in order to reduce the occurrence of impurities in the grown crystal is argon, although other inert gases also have been used or suggested. In any event, the usual procedure is to use inert gases which are substantially free of other gases, i.e., contain less than 5 ppm of any other gas with the exception of oxygen and water, the latter each being present in quantities as high as 10-25 ppm. The inert gas is usually caused to flow through the furnace at a controlled rate calculated not to disturb the crystallization front while assuring that any volatile impurities in the region of the growth zone will be swept out of the furnace so as to reduce the likelihood of the same being picked up by the growing crystalline body.

Notwithstanding the careful control of the composition of the die, crucible and other furnace components and the purity and rate of flow of the inert gas in the region of the growth interface, unpredicted variations in silicon ribbon quality have continued to be observed. Some of the variations appear to be due to the occurrence of large silicon carbide particles on the ribbon surface or in the ribbon at its surface, and/or the presence of high levels of carbon in the ribbon. There has been disagreement as to whether or not the presence of oxygen in semiconductor silicon is harmful, particularly if impurity carbon also is present. It has been suggested that oxygen should be eliminated or reduced to a negligible level in order to maximize carrier lifetime. On the other hand, U.S. Pat. No. 4,040,895 suggests that a reduction in leakage currents occurs at higher oxygen levels, e.g., $13 \times 10^{17}$ to $17 \times 10^{17}$ atoms/cc.

As disclosed in copending patent application Ser. No. 216,300, prior to this invention I (together with another person) discovered that the quality of silicon ribbons grown using a graphite die and a graphite crucible could be improved by maintaining a predetermined concentration of carbon and oxygen-containing gas in the region of the growth zone, and that the required gas concentration could be achieved by feeding carbon monoxide, carbon dioxide or oxygen to the growth region. The carbon monoxide and carbon dioxide serve as sources of oxygen. However, it is difficult with prior apparatus to control the oxygen content in the furnace in a reproducible manner and at low concentrations. Therefore, the concentration of oxygen in the ribbon tends to vary unpredictably, with a consequent variation in ribbon quality. Moreover, when growing a silicon ribbon using a crystal growth cartridge of the type described in U.S. Pat. No. 4,118,197, the providing of such gas to the growth zone can only be effectively accomplished if the cold shoe assembly positioned above the growth region is eliminated, which results directly in the lowering of the rate at which the crystal can be grown satisfactorily.

In addition to the need for controlling the quality of silicon ribbons or other configurations grown from a melt, it may be desirable to be able to control the physical and/or chemical properties of other crystals. For example, it may be desirable to incorporate a small but precise quantitity of a dopant in the melt surface of the crystal growth zone by providing a gaseous reactant in the growth zone.

It is therefore a primary object of this invention to provide an improved method of growing crystalline bodies, using a shaping member in the growth zone, which is arranged so as to more consistently produce product having predetermined and controlled physical and/or chemical characteristics. Another object of this invention is to provide a method of growing crystalline silicon bodies, using a wettable capillary die, which employs an improved gas feeding means for maintaining a predetermined concentration of carbon and oxygen containing gas in the growth zone, the gas feeding means being designed to facilitate growth at the maximum practical speed consistent with the purpose of minimizing or avoiding the formation of large silicon carbide particles at the liquid/solid interface, reducing the occurrence of silicon carbide in the grown crystalline body, and improving the electronic quality of the product. A further object of the invention is to provide an improved EFG method of growing crystals of silicon so as to substantially improve the solar energy conversion efficiency of solar cells made from such crystals.

Another primary object of this invention is to provide improved apparatus for growing crystalline bodies by the EFG method which permits improved control over the physical and/or chemical characteristics of the grown crystals while at the same time attaining maximum growth rates. Still another object is to provide apparatus of the character described which makes possible the growth of silicon ribbons having fewer large silicon carbide particles in the grown crystalline ribbon than heretofore attainable by EFG and hence improved electronic properties, giving rise to higher solar energy conversion efficiencies in solar cells made therefrom.

Other objects of the invention will in part be obvious and will in part be apparent hereinafter.

The invention accordingly comprises several steps and the relation of one or more of such steps with respect to each of the others, and apparatus embodying features of construction, combinations of elements and arrangement of parts which are adapted to effect such steps. The invention is exemplified in the following detailed disclosure, and the scope of the invention is indicated in the appended claims.

According to one aspect of this invention there is provided in a method of growing a crystallized body from a melt wherein a shaping member is used in the growth zone and there exists a meniscus of said melt between the shaping member and the liquid/solid growth interface, and wherein the growth zone is enveloped with a gas mixture containing a predetermined amount of an additive gas capable of beneficially altering the physical or chemical properties of the grown crystallized body, the improvement comprising discharging the gas mixture from gas passage means terminating proximate to the meniscus into a flow path over the melt surface of the meniscus, so as to cause said gas mixture to flow substantially uniformly over the entire surface of said meniscus.

In the case of the growing of silicon bodies, e.g., ribbons using a graphite shaping member, the reactive gas is one which provides reactive oxygen, i.e., oxygen, carbon dioxide or carbon monoxide. It may be postulated that the oxygen reacts with carbon contaminants introduced into the silicon, e.g., by contact of the silicon with the graphite components.

According to another aspect of this invention there is provided an apparatus for growing a crystallized body from a melt comprising, in combination, (a) crucible means arranged to contain a melt; (b) shaping member means extending from within the melt and providing at its upper surface means to form in a growth zone a meniscus of the melt which terminates in a liquid/solid growth interface, (c) pulling means to withdraw the crystallized body as it forms at the interface; and (d) means to provide a controlled atmosphere surrounding the growth zone, the improvement comprising means for discharging a gas mixture containing an additive gas capable of beneficially altering the physical or chemical properties of the grown crystallized body proximate to the meniscus into a flow path over the melt surface of the meniscus to effect substantially uniform contact of the gas mixture with the melt surface.

According to yet another aspect of this invention there is provided an apparatus for growing crystallized silicon in ribbon form comprising in combination graphite crucible means for holding a silicon melt; heating means to maintain the silicon in melt form; capillary die means extending from within the melt and adapted to form from the silicon melt a meniscus which terminates in a liquid/solid growth interface; pulling means to withdraw the crystallized silicon ribbon as it forms at the interface; means to maintain a predetermined thermal gradient in the ribbon as it is withdrawn form the growth interface; a die shield assembly defining a gas passage, the die shield assembly surrounding the upper end of said capillary die means and defining with a surface of the capillary die means a gas flow path arranged to direct a gas discharged from said passage essentially uniformly over substantially the entire surface of the meniscus; and gas supply means to supply a gas to said gas passage, whereby to maintain a controlled atmosphere surrounding the melt surface and the silicon ribbon as it forms at the growth interface.

For a fuller understanding of the nature and objects of the invention, reference should be had to the following detailed description taken in connection with the accompanying drawings in which:

FIG. 1 is a longitudinal cross section of a preferred embodiment of the apparatus of this invention in a furnace designed to hold a plurality of cartridges for growing a plurality of silicon ribbons simultaneously;

FIGS. 2, 3 and 4 are cross sectional views of the apparatus of FIG. 1 taken along lines 2—2, 3—3 and 4—4, respectively of FIG. 1;

In the growth of crystals by the EFG process as heretofore practiced, the usual growth conditions have comprised an ambient atmosphere consisting of high purity argon which is passed through the furnace at relatively high flow rates (15–25 volume changes per hour). This ambient atmosphere is maintained in furnaces wherein a plurality of silicon ribbons are grown simultaneously as disclosed in U.S. Pat. No. 4,118,197, as well as in furnaces in which only a single crystalline body, whether or not in ribbon form, is grown at any one time.

Essentially, the present invention involves the provision and use of improved means for discharging and directing a gas mixture containing a predetermined amount of an additive gas, capable of beneficially altering the physical or chemical properties of the grown crystal, over the melt surface or the meniscus within the crystal growth zone. In the case of silicon crystals grown in apparatus using a shaping member formed of graphite, the reactive gas is a source of oxygen which reacts with carbon contaminants in the silicon melt to reduce the formation of deleteriously large silicon carbide particles. Although it has not been proven, it is believed that the oxygen may also act to negate the harmful influence of other impurities in the grown crystalline body. As will be seen in the following detailed description, according to this invention the gaseous source of oxygen is directed against the melt surface in the crystal growth zone.

Figure 1:
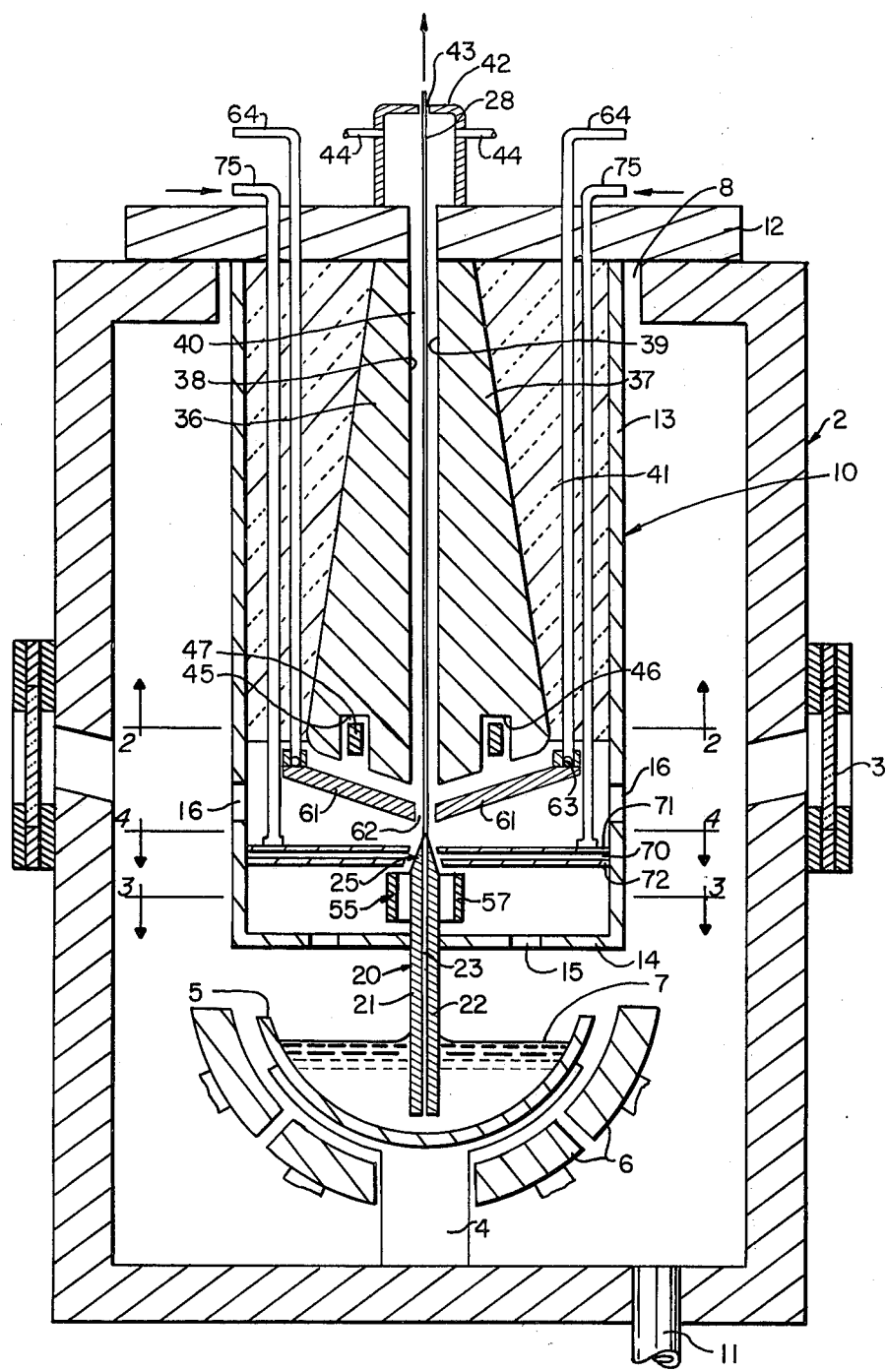

Referring now to FIG. 1, the illustrated apparatus is a furnace in the form of an enclosure 2 having sight ports 3 for viewing crystal growth. Mounted within the furnace by means of a suitable support 4 is a graphite crucible 5. Also mounted within the furnace enclosure is a plurality of electrical resistance graphite heaters 6. Although not shown, it is to be understood that these heaters are connected to a suitable electrical power supply located externally of the furnace. Heaters 6 are spaced and disposed so as to supply heat to crucible 5 to convert the silicon feed material which it contains to a melt 7.

Although only one cartridge is shown, it is to be understood that the furnace embodiment of FIGS. 1–6 is adapted for the incorporation of a plurality of separate cartridges 10 for growing individual crystalline ribbons, with the cartridges being generally similar to the cartries disclosed in U.S. Pat. No. 4,118,197. This requires that each cartridge contain a shaping member, means to control temperatures within the cartridge and means to provide a predetermined gaseous atmosphere around the growing crystal body.

The upper end of furnace enclosure 2 is formed with an access port 8 through which a cartridge 10 may be introduced into the furnace enclosure and disposed as shown in the drawing. Additionally the lower end of enclosure 2 has an inlet port fitted with a conduit 11 which is connected to a source (not shown) of a suitable gas, e.g. an inert gas such as argon. The upper end of cartridge 10 preferably comprises a metal header plate 12 which serves as a heat sink and also determines by engagement with the upper end wall of the furnace the extent to which the cartridge may be lowered into the furnace.

Cartridge 10 comprises an outer housing 13 of rectangular cross section which is made of a heat resistant material and is attached to and depends from header 12. Housing 13 terminates in a die support member 14 which has cut therethrough a plurality of gas passages 15 for gas admitted via conduit 11.

Figure 5:
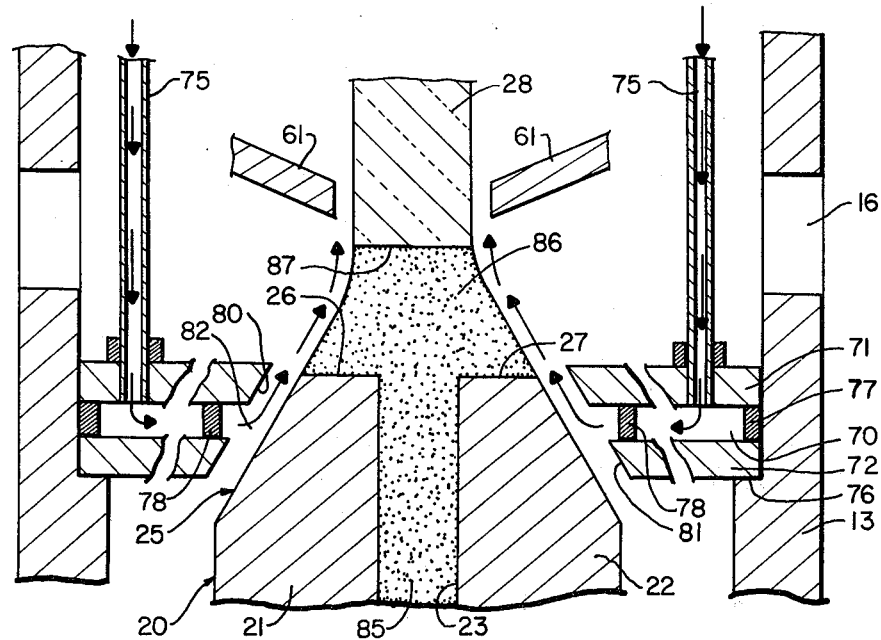
FIG. 5 is an enlarged cross sectional view of the means for directing the gas stream against the melt surface within the growth zone.

Sight holes 16 are so located in cartridge housing 13 to provide a line of sight to the growth zone of the crystal being formed. The shaping member shown in FIGS. 1-6 is a capillary die 20 which may be constructed in various ways. In the embodiment illustrated the die comprises parallel graphite plates 21 and 22 arranged to define a capillary slot 23 which extends for substantially the full breadth of the plate sections and throughout their height. Capillary die 20 is affixed to support member 14 and it is of a height such that when cartridge 10 is inserted into enclosure 2, the lower end of die 20 is well submerged below the surface of melt 7. Die 20 extends into housing 13 and terminates in an upper section 25 in which die plates 21 and 22 have tapered sides terminating in end surfaces 26 and 27 as shown in enlarged detail in FIG. 5. The width of each end surface 26 and 27, i.e., the horizontal left-to-right dimension in FIG. 5, is relatively small and typically is less than 0.010 inch. In accordance with the teachings of U.S. Pat. Nos. 4,118,197 and 4,158,038, through the use of an appropriate silicon seed crystal a silicon ribbon 28 is pulled upwardly from the die 20, using any suitable, well-known pulling mechanism.

Within cartridge 10 there are provided means for controlling the temperature of the ribbon during and after formation and growth, as well as means for maintaining the capillary die within a predetermined temperature range.

Disposed within cartridge housing 13 and attached to and depending from header plate 12 are two heat conductive graphite plates 36 and 37 having rectangular parallel internal faces 38 and 39 spaced apart to define a narrow rectangular passageway 40 through which the crystal ribbon 28 is drawn. Plates 36 and 37 form the heat conductive medium of an afterheater designed to function as a temperature profile controller in accordance with the teaching of U.S. Pat. No. 4,158,038. A suitable insulating material 41, e.g., a graphite felt, is packed into cartridge housing 13 around plates 36 and 37 to reduce heat loss. Passageway 40 terminates in an external gas lock 42 having a slot 43 through which ribbon 28 is drawn. Fluid lines 44 made it possible to circulate an inert gas, e.g., argon, through the gas lock with the inert gas exiting via slot 43. The gas lock serves to prevent backflow of outside air into slot 40.

Figure 2:
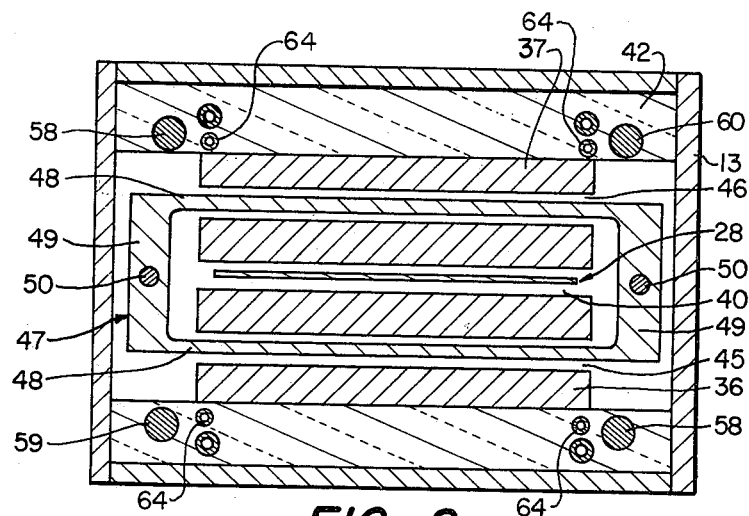

As will be seen from FIGS. 1 and 2, the lower ends of plates 36 and 37 are notched to form two like recesses 45 and 46 to accommodate an electrical resistance afterheater 47 (FIG. 2), made of graphite. Afterheater 47 may take various shapes and in the illustrated case it is shaped so that in plan view (FIG. 2) it is in the form of a bar having a rectangular aperture, with two side sections 48 extending along recesses 45 and 46 and the two end sections 49 extending alongside of the opposite edge surfaces of plates 36 and 37. Heater 47 is affixed to and supported by a pair of electrical current feed bars 50 (FIG. 2).

Figure 3:
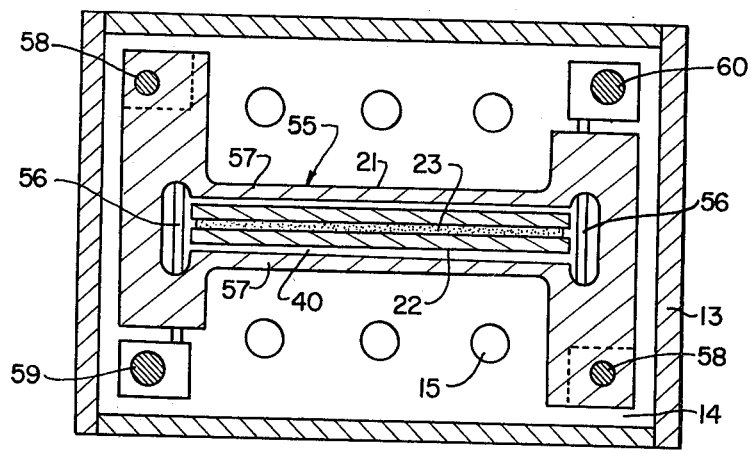
Figure 4:
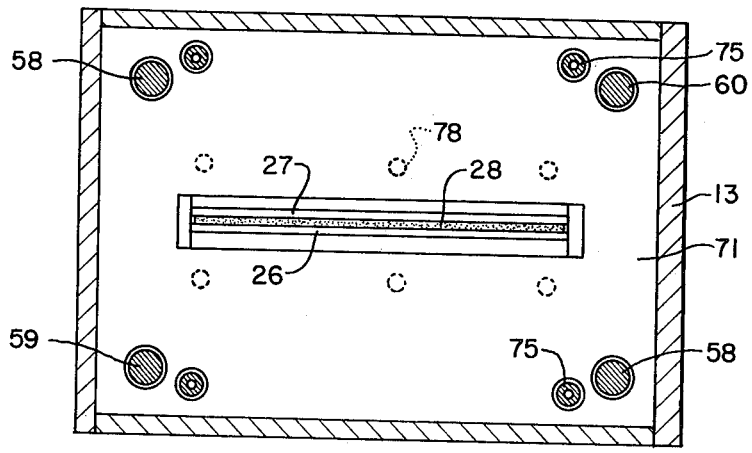

As shown in FIGS. 1 and 3, the cartridge also includes an electrical resistance die heater 55 and a pair of electrical resistance die end heaters 56. Heater 55 has face heating sections 57 that extend along the broad sides of the upper end 25 of the capillary die 20. Heaters 55 and 50 are made of graphite. Heater 55 is affixed to and supported by first and second electrical current feed bars 58 which are anchored in header plate 12. One end heater 56 is supported and energized by one of the feed bars 58 and a third feed bar 59, while the other end heater is supported and energized by the other feed bar 58 and a fourth feed bar 60. In accordance with the teachings of U.S. Pat. No. 4,118,197, the electrical feed bars extend lengthwise parallel to plates 36 and 37 and are anchored in header plate 12. Header plate 12 is provided with suitable means (not shown) for connecting the various current feed bars to a source of electric power. Heater 47 heats the lower ends of plates 36 and 37 and heaters 55 and 56 heat the four sides of the upper end of capillary die 20. In presently known devices the cartridge also includes one or more flat plate heat shields for upper section 25 of capillary die 20. These heat shields 71, 72, lying normal to the axis of the capillary, have elongate center slots through which the upper end 25 of die 20 extends.

In order to stabilize the silicon ribbon above the growth interface and to make it possible to draw it at a relatively rapid rate, means are provided to cool it to between about 600-1100 degrees C. These means take the form of a cold plate 61 (also called a "cold shoe") having a central opening 62. The plate, formed of a high heat conductive material such as nickel or molybdenum, is cooled by a peripheral hollow coil 63 through which cooling water is circulated by means of fluid lines 64 which extend externally of the cartridge. Such a cold plate is described in detail in U.S. Pat. Nos. 4,118,197 and 4,158,038.

To the extent already described, the apparatus of FIGS. 1-5 is old and well known. According to the usual mode of operation prior to this invention, argon gas of highest available purity is passed continuously into the furnace enclosure via conduit 11 at relatively high rates (e.g., at a rate calculated to provide between about 15-25 volume changes of gas per hour). Ribbon 28 is continuously grown from the melt at the upper end 25 of die 20 and the melt consumed in formation of the ribbon is replaced by upward flow of melt in the capillary passageway 23 of the die. Subsequent to being cooled by cold plate 61, the ribbon 28 is again heated by heater 47 to about 1200 degrees C. to relieve thermal stresses. Finally the ribbon is controllably cooled through the use of the temperature profile controller which comprises heat conductive plates 36 and 37 and insulation 42 and which provides a linear or near-linear cooling zone characterized by the inner surfaces of plates 36 and 37 extending parallel and closely adjacent to the opposite broad sides of ribbon 28. Heat is discharged from the upper end of the heat conducting plates 36 and 37 through header plate 12, while heat is supplied to the lower end of the same plates by heater 47, whereby a temperature gradient is established lengthwise in the heat conducting plates with the lower ends of those plates being at a substantially higher temperature than their upper ends. The ribbon 28 is pulled at a controlled speed (usually in the range of about 2.0 to about 4.0 cm/min. for a silicon ribbon having a thickness of about 0.015 inch and a width of about 4 inches) by means of a suitable pulling mechanism (not shown). The pulling speed is set according to the rate at which the latent heat of fusion is removed from the ribbon at the crystallization front, i.e., the interface between the growing ribbon and the melt film at the upper end 25 of die 20. Cold plate 61, in accelerating the rate of removal of the latent heat of fusion, leads to maximizing the pulling speed.

In conventional EFG operation for growing silicon ribbon the temperature profile controller is arranged so that (1) plates 36 and 37 are at a temperature at their lower ends close to but below the melting point of silicon and at a temperature at their upper ends close to but preferably below the temperature at which significant plastic flow will occur in silicon, (2) plates 36 and 37 will induce a controlled temperature gradient along the length of the ribbon as the ribbon moves along passageway 40, and (3) the ribbon will be at a temperature below that at which no significant plastic flow will occur therein as, or immediately after, it passes beyond the upper ends of plates 36 and 37. This mode of operation aids in causing the ribbon to have little or no residual stresses after it has cooled to room temperature. Therefore, since the melting point of silicon is about 1415 degrees C. and little significant plastic flow will occur in a silicon body after it has been cooled to below a temperature of between about 600 degrees C. and about 800 degrees C., the preferred practice is to operate heater 55, the temperature profile controller and cold plate 61 so that the temperature of the die in the region of heater 55 is about 20-30 degrees C. above the melting point of silicon, the average vertical temperature gradient along plates 36 and 37 is at some value between about 25 and 100 C. degrees/cm, with the temperature at their lower ends being between about 1050 and 1250 degrees C. and the temperatures at their upper ends being at about 600 degrees C. or less, and the cold plate 61 is at a temperature of 400–800 degrees C.

It is known that certain gases tend to exist or be produced in the furnace, e.g., by outgassing of furnace components. Since many native furnace ambient gases are detrimental to crystal growth and product quality, they must be removed from the furnace. In an open furnace as shown in FIG. 1 (so called to distinguish it from a furnace where the enclosure is kept under a vacuum and hence must be completely air-tight), there is also the problem of leakage of air into enclosure 2 via passageway 40, and also around the cartridge. The enclosure 2 usually is not provided with a gas outlet port and instead the only intended exit path for the argon purge gas is via cartridge passageway 40. By proper choice of the pressure and flow rate of the argon introduced through lines 41 to lock 42, it is possible to prevent the backstreaming of air into cartridge 10 through passageway 40. However, this does not eliminate the problem of the contaminating gases which are generated within the furnace and which have an undetermined effect on the grown crystal properties.

As already noted above, prior to this invention I and another had determined that by deliberately introducing a carbon-containing gas, perferably one which also contains oxygen, into the gaseous environment in the furnace and cartridge, and permitting the resulting gas mixture to diffuse to the meniscus surface, it is possible to significantly increase the as-grown ribbon quality and to reduce the frequency of SiC particle pickup on the ribbon surface. Both of these improvements lead to materially improving the performance of the silicon crystalline material when incorporated into photovoltaic cells. In this prior art, the carbon-containing gas is introduced via the cartridge to the general area above the die through passages which are defined between the graphite plates and the insulation and which lead by way of a manifold and a plurality of inclined passages into the lower end of the passageway through which the ribbon is pulled. This means that the additive gas enters the growth slot (comparable to passageway 40) sufficiently above the liquid/solid growth interface to make it necessary to rely on momentum and diffusion to reach the interface. This arrangement also requires the additive gas to move counter to the flow of the main zone argon stream used to continuously flush the furnace and cartridge, making it difficult to attain and maintain a uniform additive gas distribution pattern over the crystal surface. A further problem with my prior joint development is that it was not possible to incorporate a cold shoe in the cartridge because it interfered with the gas flow pattern. Hence, although better quality ribbons could be formed, the rate at which they could be pulled was less than the maximum rate at which growth could be conducted using cold shoe(s).

Although this prior method has resulted in the production of silicon ribbons having more desirable properties than those grown without an additive gas, oxygen-containing gas, I have now found it possible to attain silicon crystal growth with improved properties, e.g., a high SPV diffusion length (minority carrier diffusion length as determined by the surface photo voltage technique) without suffering any decrease in pulling speed. This is achieved by providing mechanical means proximate to the meniscus for discharging and directing the additive oxygen gas source onto and over the melt meniscus uniformly along essentially its entire surface. To this end the mechanical means comprises a passage means surrounding the top end 25 of capillary die 20. As shown in FIGS. 1 and 5, these passage means preferably constitute a passage 70 defined by a heat shield assembly which comprises parallel graphite heat shields 71 and 72 which surround the upper end of the die. The desired gas mixture, e.g., argon mixed with between about 50 ppm and 5000 ppm of an oxygen-containing gas in the case of silicon formed by a graphite die, is brought into passage 70 through a plurality of gas inlet lines 75 attached to upper heat shield 71 and in fluid communication with passage 70. Gas inlet lines 75 pass up through insulation 42 and are connected to a suitable source (not shown) of the gas mixture to be introduced.

Preferably as shown in FIG. 5, heat shields 71 and 72 are set into the walls of housing 13 on a shoulder 76 cut around the periphery thereof and are held in spaced relationship by means of an outer graphite spacer ring 77 and a plurality of mututally spaced spacer posts 78. It is, of course, within the scope of this invention to use any spacing means to maintain heat shields 71 and 72 in spaced relationship to one another as well as to use other suitable means for holding the heat shield assembly within the cartridge housing. In addition to defining passage 70, heat shields 71 and 72 assist in maintaining a suitable temperature distribution around the upper end of the die.

Figure 6:
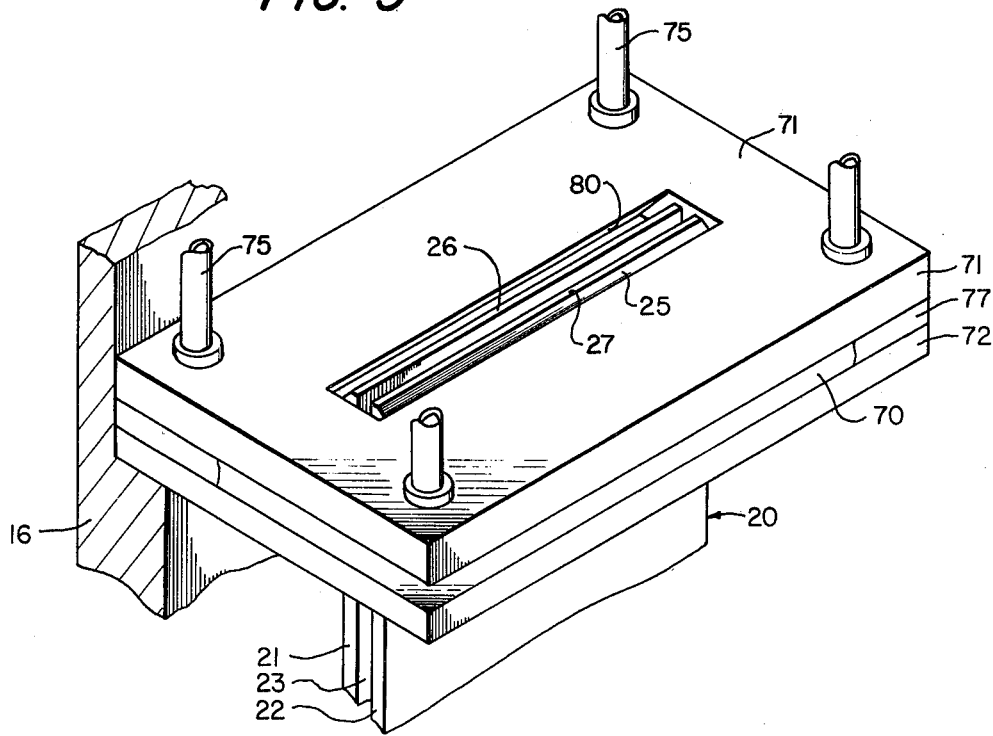
FIG. 6 is a perspective view of the means illustrated in FIG. 5.

As will be seen in the fragmentary enlarged cross sectional and perspective views of FIGS. 5 and 6, heat shields 71 and 72 have central longitudinal cutouts 80 and 81, respectively, to provide in combination an elongate central opening into which the upper section 25 of die plates 21 and 22 extend. As shown in these drawings the upper section 25 of the capillary die plates have inwardly inclined side surfaces, and preferably the side surfaces of the heat shields which define cutouts 80 and 81 are complementarily inclined so as to define a narrow gas passage 82 around the upper section of the capillary die.

In the growing of a silicon body, herein illustrated in ribbon form, the silicon melt 85 from crucible melt 7 rises by capillary action through capillary slot 23, and as it emerges it wets the narrow upper end surfaces 26 and 27 of the die. As this melt is pulled upwardly it forms a meniscus 86 which extends to the liquid/solid growth interface 87, beyond which it has become first a plastic and then a solid crystallized body 28. Within the area of meniscus 86 is the growth zone. From this it will be seen that the melt forming the meniscus 86 presents active surfaces for contact with one or more reactive or additive gases, i.e., gases which can be used to control and/or modify the chemical and/or physical properties of the grown cyrstal.

In the practice of this invention such a gas or gases are caused to flow such that they make substantially uniform direct contact with essentially the entire suface of the meniscus to achieve a controlled uniform effect on the grown crystal 28. In the embodiment of FIG. 5, the gases flow upwardly along the entire meniscus surface. Since the desired amount of such an additive gas is normally very small, it will generally be preferable to introduce it in an inert gas, e.g, argon. As will be apparent from FIG. 5, the gas mixture, e.g., argon and carbon dioxide, flows through inlet lines 75, through passage 70 and then out into passage 82 upwardly to uniformly envelope the surfaces of meniscus 86 as shown by the arrows. Thus the additive gas, no matter what its flow pattern, is provided directly and uniformly in a manner which facilitates control over the concentration of the additive gas in contact with the meniscus. In the embodiment of FIG. 5, it will be appreciated that since inert gas introduced through conduit 11 will flow upwardly through the furnace and the cartridges within the furnace, there is no countercurrent gas flow to disrupt the flow pattern of the additive gas.

It will, of course, be understood that the die or other shaping member may be of any configuration and that the cutouts in heat shields 71 and 72 may be shaped to conform to such configurations to provide the required gas flow pattern around the melt surface below the liquid/solid interface. In those cases where silicon is being grown and the passage-defining heat shields are below the meniscus and near the inclined surfaces of members 21 and 22 as in FIG. 1, the shields should be formed of graphite because of the temperature at which they must function. In the case where the hollow heat shield assembly is above the growth zone and exposed to a temperature below the melting point of silicon, it may be made of quartz or graphite. Where the heat shield members 71 and 72 are located at or close to the upper end of the die, they may not be made of quartz since quartz tends to soften and sag at the melting point of silicon.

The prior art contains references to apparatus in which means are provided to direct inert gases against crystals above the liquid/solid interface. Exemplary of such prior art are U.S. Pat. Nos. 3,124,489 and 3,265,469 and French Pat. No. 1,235,714 published Feb. 5, 1962. In U.S. Pat. No. 3,124,489 opposing single jets of an inert gas are directed against a crystal ribbon above the growth interface to cause the material to cool below the outlet of a die mouth, thus forming the liquid/solid interface within the die. In U.S. Pat. No. 3,265,469 a plurality of jets of an inert or non-reactive gas are directed downwardly from above the liquid/solid interface against the melt surface maintained in a convex configuration by an annular lip. French Pat. No. 1235174 teaches the use of downwardly directed gas jets to control the diameter of a crystal rod pulled from a melt. Thus the character of the gases used in the prior art, the flow patterns imparted to them, the locations of their introduction, and the purposes for which they are used, are in direct contrast to the method and apparatus of this invention.

Figure 7:
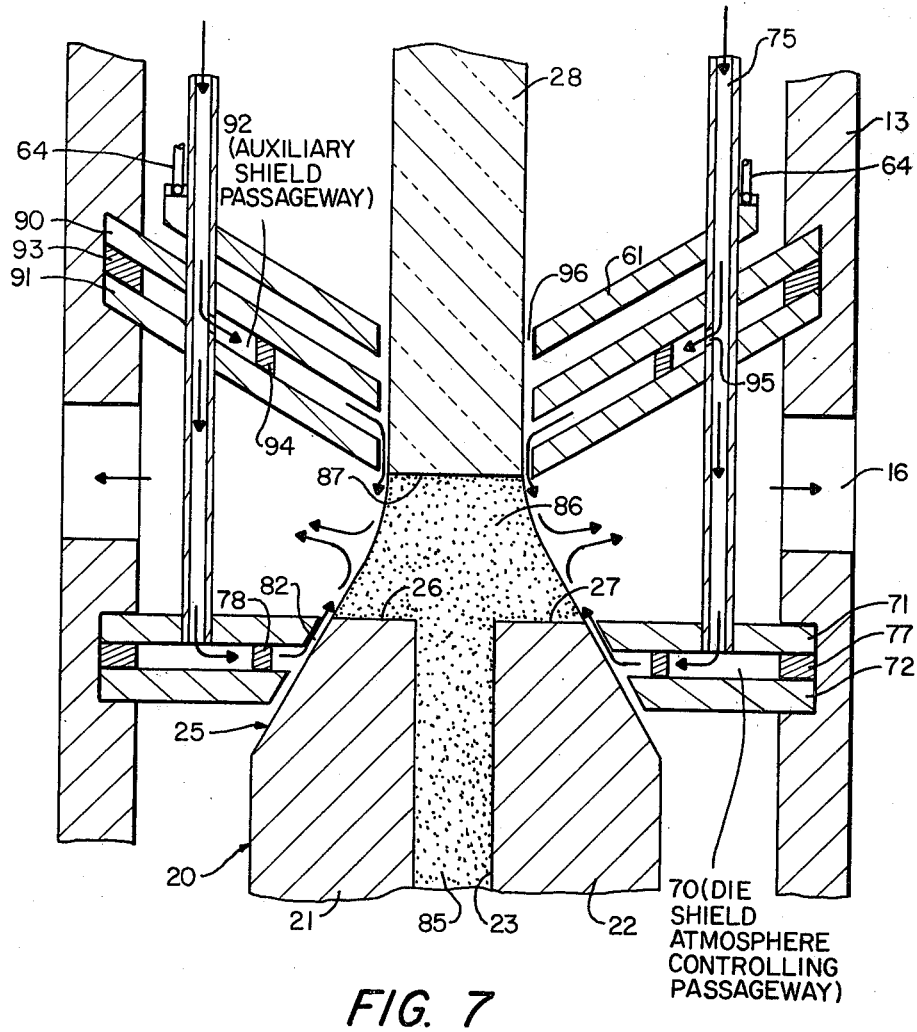
FIG. 7 is an enlarged cross sectional view of a modification of the embodiment of the means of FIG. 5 for directing the gas stream against the melt surface within the growth zone.

FIG. 7, in which the same reference numerals are used to identify the same components shown in FIGS. 1-6, illustrates the addition of a second or auxiliary passage defining means to introduce an additional quantity of the same additive gas directed through passage 70 or a predetermined quantity of another gas. These means comprise parallel heat shields 90 and 91, defining between them a passage 92. The shields are located below cold shoe plate 61 and are shown to be held in spaced relationship by an outer ring 93 and a plurality of spacer posts 94, and the assembly is secured in a groove cut in the walls of housing 13. In growing silicon shields 90 and 91 may be made of quartz or silicon since they are located in a region having a temperature below the melting point of silicon while plates 71 and 72 must be made of graphite since they are exposed to temperatures at or above the melting point of silicon. Gas inlets 75 pass through this upper shield assembly and have gas ports 95 which open into passages 92. As in the case of the lower die shield assembly, the upper shields 90 and 91 have elongated cutouts to provide a gas flow passage 96 around crystal 28. Gas leaving auxiliary passages 92 flows downwardly through passage 96, merging with the gas from passage 82 provided by the lower die shield assembly passage means. The gas from passages 82 and 92 leaves the cartridge via openings 16 which may be connected to gas lock 42 for discharge from the furnace. If openings 16 are omitted or closed off by a heat-resistant glass window, the passageway 96 is preferably made larger and/or the rate of gas flow in passage 92 is made smaller than that in passage 70, so that the gas from passages 70 and 92 will tend to flow upwardly through passage 96 around the crystal.

In the embodiment of FIG. 7, the same gas mixture, e.g., an inert gas containing the reactive or additive gas, will be directed along the entire crystal surface exposed to the additive gas flow pattern. It is also within the scope of this invention to provide separate inlet lines, comparable to line 75, for passages 70 and 92, in which case the gases directed against the meniscus or growth zone melt surfaces and against the surfaces of the crystal above liquid/solid interface 87 may be of different compositions. In either case the gas discharged via passages 82 and 92 assists in maintaining a predetermined additive gas concentration in the growth zone.

Figure 8:
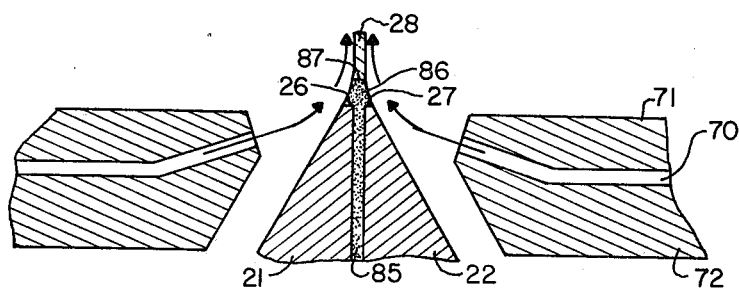
FIG. 8 is a partial cross section of another embodiment of the means for directing the gas stream against the surface of the meniscus.

FIG. 8 shows a modification in which the heat shields 71 and 72 are set and shaped so that shield 71 is below the upper end of the capillary die formed by members 21 and 22 and the exit end of passage 70 is directed upwardly so as to discharge gas toward the upper end of the die and the meniscus 86.

Figure 9:
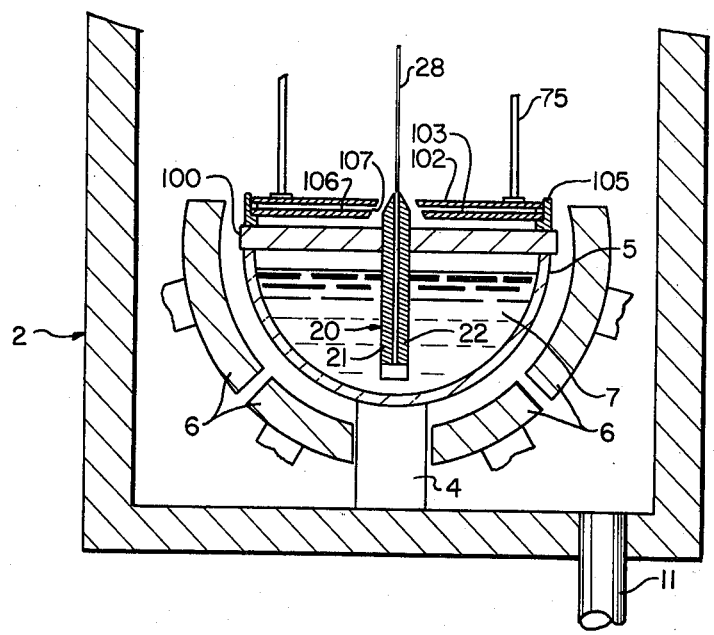
FIG. 9 is a partial longitudinal cross section of another embodiment of the apparatus of this invention adapted to grow a single silicon ribbon in a furnace.
Figure 10:
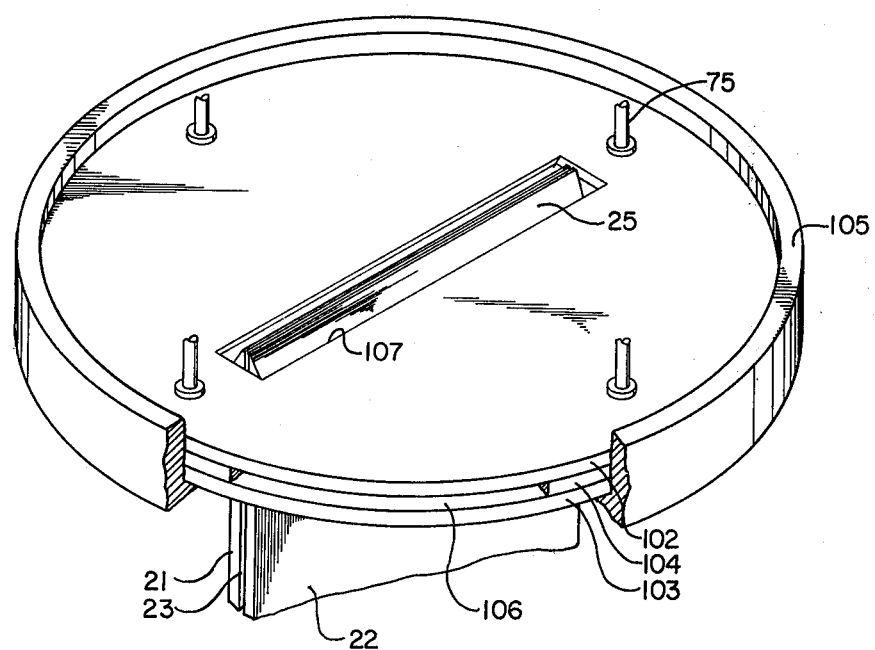
FIG. 10 is a perspective view of the means for directing the gas stream against the melt surface within the growth zone in the embodiment of FIG. 9.

FIGS. 9 and 10 illustrate in fragmentary cross sectional and perspective views the application of this invention to single-crucible furnaces. Crucible 5 and heaters 6 are of circular configuration, and capillary die 20 is supported by a crucible cover plate 100 which also supports a heat shield assembly comprising an upper shield 102 held in spaced relationship from lower shield 103 by an annular ring 104. The heat shield assembly is set in an inwardly flanged ring 105 which maintains shield 103 spaced from cover 100. Gas inlet lines provide gas to passage 106 defined between the shields 102 and 103. As seen in FIGS. 9 and 10, shields 102 and 103 have central cutouts 106 corresponding to and for the same purpose as detailed above in conjunction with the discription of FIG. 5.

The method of this invention may be further described by the following examples which are meant to be illustrative and not limiting.

EXAMPLE I

Apparatus as shown in FIGS. 1–6 was used to grow silicon ribbons having a width of about 4 inches and a thickness of about 0.015 inch. The melt was boron-doped to 4 ohm-cm and the flow of argon introduced by way of conduit 11 through the main zone of the furnace was maintained at 6 liters/minute. All samples were grown at 3.0 to 3.5 cm/minute. Several runs were made varying the composition of the gas mixture introduced into the cartridge by way of lines 75 and passages 70 (FIG. 5) and the rate at which the gas mixtures were caused to flow. These operational parameters are tabulated in Table I. In order to evaluate the effect of the introduction of the additive gases, the average minority carrier diffusion length $\overline{L}_D$ was determined by the surface photo voltage technique. These values are also given in Table I.

TABLE I

Effect of Additive Gas Directed Onto Meniscus on Average Minority Carrier Diffusion Length, $\overline{L}_D$, of Crystals Grown

| Sample No. | Gas Mixture Directed Against Meniscus | Amount of Additive Gas in Gas Mixture (ppm) | $\overline{L}_D$ of Silicon Crystal (m) |
|---|---|---|---|
| 1 | Argon | — | 21.1 |
| 2 | CO in Argon | 500 | 44.6 |
| 3 | CO in Argon | 670 | 33.0 |
| 4 | Argon | — | 18.9 |
| 5 | $CO_2$ in Argon | 1300 | 45.3 |
| 6 | $CO_2$ in Argon | 2300 | 34.4 |
| 7 | $CO_2$ in Argon | 700 | 27.5 |

From the data of Table I and from other experimental data, I have determined that for the operating conditions employed in these examples, the optimum amount of the source of oxygen carried in the argon and discharged from the passage terminating proximate to the bottom of the meniscus melt ranges between about 50 ppm and 5000 ppm of the gas mixture, i.e., argon with carbon monoxide or carbon dioxide. That the contacting of the meniscus with the oxygen containing gas within the range specified has a substantial benefit on at least one of the physical properties, i.e., $L_D$ of the cyrstals thus grown is readily evident.

The data in Table I show that relatively minor changes in the concentrations of the CO or $CO_2$ added to the argon effect relatively major changes in the $L_D$ values of the grown ribbon. By delivering the CO or $CO_2$ very close to the meniscus surface and importing to the additive gas a flow pattern which effects direct contact with the meniscus, it is possible to accurately and uniformly control the physical property of the grown crystal by making very small changes in the additive concentration. Similar results may be achieved by using a suitable mixture of $O_2$ and argon or a mixture of those gases with an additional quantity of $CO_2$ or CO, e.g., argon with 2300 ppm $CO_2$ and 23 ppm $O_2$.

EXAMPLE II

Silicon ribbons having a width of about 4 inches and a thickness of about 0.015 inch were grown according to the procedure and other conditions of Example I except that the cartridge did not have a hollow heat shield assembly between the cold shoe and die and the $O_2$-containing gas mixture was introduced to the furnace at the rate of 2 liters/minute via passages in plates 36 and 37 which intersect the passageway 40 above the level of cold shoe plate 51. Several runs were made varying the composition of the gas mixture introduced to the cartridge and the rate at which that gas mixture was caused to flow. The main gas flow rate via conduit 11 varied from 0 to 10 l/minute. The pulling rate was 3.4 cm/minute. The average minority carrier diffusion length $\overline{L}_D$ was determined by the surface photovoltage technique and these values are given in Table II.

TABLE II

| Sample No. | Gas Mixture Introduced to Cartridge | Amount of Additive Gas in Gas Mixture (ppm) | $\overline{L}_D$ of Silicon Crystal (m) |
|---|---|---|---|
| 1 | Argon | — | 17.9 |
| 2 | CO in Argon | 1000 | 18.1 |
| 3 | CO in Argon | 1000 | 21.8 |
| 4 | CO in Argon | 5000 | 11.6 |
| 5 | CO in Argon | 1000 | 13.7 |

The relatively low values for the average minority carrier diffusion length set forth in Table II are believed due to the fact that the cold shoe prevented the gas introduced to the cartridge from adequately enveloping the meniscus and caused it interact with the cold shoe material so as to add undesirable impurities to the silicon melt at the die top.

It will thus be seen that the objects set forth above, including those made apparent from the preceding description, are efficiently attained and, since certain changes may be made in the above method and the constructions set forth without departing from the scope of the invention, it is intended that all matter contained in the above description or shown in the accompanying drawings shall be interpreted as illustrative and not in a limiting sense.

What is claimed is:

1. An apparatus for growing crystallized silicon in ribbon form comprising, in combination:
   (a) crucible means to hold a silicon melt;
   (b) heating means to maintain said silicon in melt form;
   (c) capillary die means in the form of two elongate parallel die plates defining therebetween a capillary slot, extending from within said melt and being provided at their upper surfaces with means to form of said silicon melt a meniscus which terminates in a liquid/solid growth interface;
   (d) pulling means to withdraw the crystallized silicon ribbon as it forms at said interface;
   (e) means to maintain a predetermined thermal gradient in said ribbon as it is withdrawn from said growth interface;

(f) spaced die shields defining therebetween a gas passage, said die shields surrounding the upper end of said capillary die means and defining with the surface thereof a gas flow passage arranged to direct a gas upwardly and essentially uniformly over substantially the entire surface of the melt surface of said meniscus;

(g) gas supply means to supply said gas to said gas passage defined between said spaced die shields; and (h) means to maintain a controlled atmosphere surrounding said melt surface and said silicon ribbon as it forms at said growth interface.

2. An apparatus in accordance with claim 1 wherein said means to maintain a controlled atmosphere comprises housing means and means to introduce into the bottom of said housing means an inert gas at a predetermined flow rate.

3. An apparatus in accordance with claim 2 including cartridge housing means within said housing means supporting said capillary die means and said spaced die shields and containing said means to maintain a predetermined thermal gradient.

4. An apparatus in accordance with claim 2 wherein said means to supply said gas to said gas passage defined between said spaced die shields comprise a plurality of gas conduits providing fluid communication between said gas passage and a source of said gas external of said housing.

5. An apparatus in accordance with claim 4 including auxiliary spaced shields above said spaced die shields and defining therebetween an auxiliary gas passage, said auxiliary shields surrounding said crystallized body above said liquid/solid growth interface and defining with the surface thereof an auxiliary gas flow passage arranged to provide a flow of gas, which is a continuation of the flow of said gas over said melt surface, upwardly over said crystallized silicon ribbon; and auxiliary gas supply means to provide gas to said gas passage between said auxiliary shields.

6. An apparatus in accordance with claim 5 wherein said gas supply means serves as said auxiliary gas supply means.

7. In an apparatus for growing a crystallized body from a melt comprising, in combination, (a) graphite crucible means arranged to contain a melt, (b) graphite shaping member means extending from within said melt and providing at its upper surface means for forming in a growth zone a meniscus of said melt which terminates in a liquid/solid growth interface, (c) pulling means for withdrawing the crystallized body as it forms at said interface, and (d) means for providing a controlled atmosphere surrounding said growth zone, the improvement comprising means for directing a gas mixture stream containing an additive gas capable of beneficially altering the physical or chemical properties of the grown crystallized body proximate to the bottom of said meniscus into a flow path leading upwardly along the melt surface of said meniscus to effect substantially uniform direct contact of said gas mixture with said melt surface, said means for directing said gas mixture stream along said melt surface comprising (a) die shield means surrounding the upper end of said capillary die means and defining a gas flow passage arranged to direct said gas mixture from said gas passage upwardly along said melt surface, and (b) gas supply means to provide said gas mixture to said gas passage.

8. An apparatus in accordance with claim 7 including auxiliary shield means above said die shield means and defining an auxiliary gas passage, said auxiliary shield means surrounding said crystallized body above said liquid/solid growth interface and defining with the surface thereof an auxiliary gas flow passage arranged to provide a flow of gas along said crystallized body surface; and auxiliary gas supply means to provide gas to said gas passage between said auxiliary shield means.

9. An apparatus in accordance with claim 8 wherein said gas supply means to provide said gas mixture to said gas passage between said die shield mean serves as said auxiliary gas supply means.

10. An apparatus in accordance with claim 7 wherein said graphite shaping member means is a capillary die means having an elongate configuration and arranged to form said crystallized body in ribbon form.

* * * * *